(12) United States Patent
Marsh

(10) Patent No.: US 6,626,999 B1
(45) Date of Patent: Sep. 30, 2003

(54) VAPOR FORMING DEVICES

(75) Inventor: Eugene P. Marsh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/542,429

(22) Filed: Apr. 4, 2000

Related U.S. Application Data

(62) Division of application No. 09/352,817, filed on Jul. 13, 1999, now Pat. No. 6,318,381.

(51) Int. Cl.$^7$ .............................................. C23C 16/00
(52) U.S. Cl. ............... 118/726; 118/723 E; 118/723 V
(58) Field of Search .................. 118/723 E, 723 ER, 118/723 VE, 726, 723 EB; 156/345.43, 345.47

(56) References Cited

U.S. PATENT DOCUMENTS

| | | | |
|---|---|---|---|
| 4,526,805 A | * 7/1985 | Yoshizawa .................. 118/50.1 |
| 5,052,339 A | * 10/1991 | Vakerlis et al. .......... 118/723 E |
| 5,356,478 A | 10/1994 | Chen et al. ..................... 134/1 |
| 5,362,328 A | 11/1994 | Gardiner ...................... 118/726 |
| 5,374,314 A | * 12/1994 | Babacz ................ 118/723 MP |
| 5,523,261 A | 6/1996 | Sandhu ........................ 437/228 |
| 5,616,208 A | 4/1997 | Lee ............................. 156/345 |
| 5,647,953 A | 7/1997 | Williams et al. .......... 156/643.1 |
| RE35,785 E | * 5/1998 | Sandhu et al. ................ 278/60 |
| 5,788,799 A | 8/1998 | Steger et al. ................ 156/345 |
| 5,882,416 A | 3/1999 | Van Buskirk et al. ....... 118/726 |
| 5,882,424 A | 3/1999 | Taylor et al. ................. 134/1.1 |
| 5,891,349 A | * 4/1999 | Tobe et al. .................... 216/68 |
| 5,952,060 A | * 9/1999 | Ravi ........................... 427/577 |
| 5,983,906 A | 11/1999 | Zhao et al. .................. 134/1.1 |
| 6,014,979 A | 1/2000 | Van Autryve et al. ....... 134/1.1 |
| 6,051,286 A | 4/2000 | Zhao et al. .................. 427/576 |
| 6,060,397 A | 5/2000 | Seamons et al. ............ 438/694 |
| 6,083,557 A | 7/2000 | Belcher et al. ................ 427/99 |
| 6,110,531 A | 8/2000 | Paz de Araujo et al. ....... 427/255.25 |
| 6,125,859 A | 10/2000 | Kao et al. ..................... 134/1.1 |
| 6,216,708 B1 | * 4/2001 | Agarwal ...................... 134/1.1 |
| 6,271,498 B1 | 8/2001 | Miyake et al. ......... 219/121.43 |
| 6,277,201 B1 | * 8/2001 | Nishikawa ................... 118/726 |
| 6,379,575 B1 | * 4/2002 | Yin et al. ...................... 216/67 |

FOREIGN PATENT DOCUMENTS

| | | | | |
|---|---|---|---|---|
| JP | 04107826 A | * | 4/1992 | ........... H01L/21/31 |
| JP | 11012740 A | * | 1/1999 | ........... C23C/16/44 |
| JP | 2000087243 A | * | 3/2000 | ......... C23C/16/448 |

OTHER PUBLICATIONS

"Handbook of Thin–Film Deposition Processes and Techniques", edited by Kaus Schuegraf. Noÿes Publications, New Jersey, pp. 6–7, 1988.

* cited by examiner

*Primary Examiner*—Luz L. Alejandro
*Assistant Examiner*—Michelle Crowell
(74) *Attorney, Agent, or Firm*—Wells St. John P.S.

(57) ABSTRACT

The invention encompasses a vapor forming device. Such device includes a non-vapor-state-material input region, a vaporization surface, and a flow path between the non-vapor-state-material input region and the vaporization surface. The device further includes a vapor-state-material output region, and a vapor flow path from the vaporization surface to the vapor-state-material output region. Additionally, the device includes a first plasma electrode spaced from the vaporization surface, and plasma generation circuitry configured to utilize the vaporization surface as a second plasma electrode such that a plasma can be formed between the first and second plasma electrodes.

13 Claims, 3 Drawing Sheets

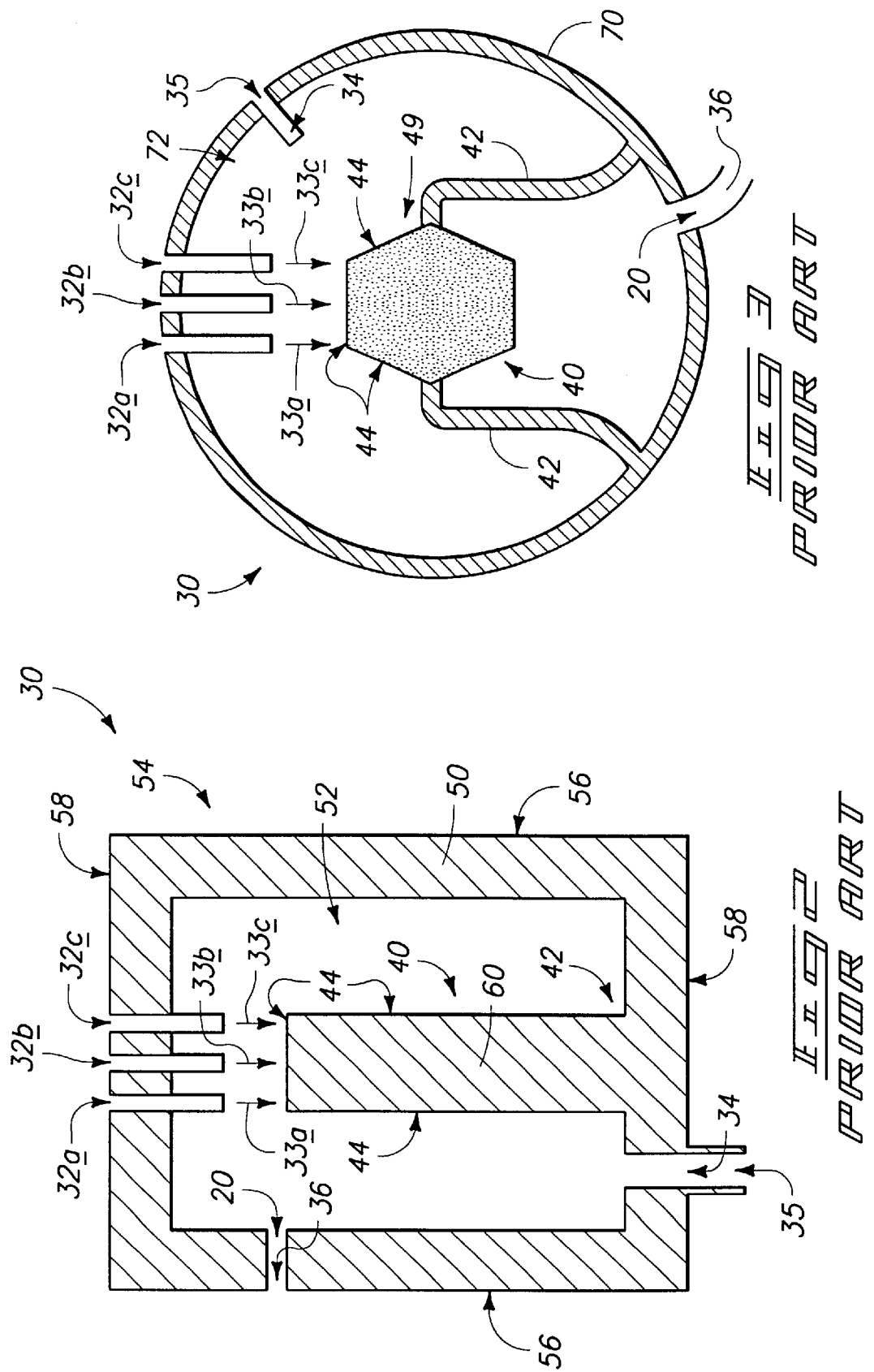

VAPOR FORMING DEVICES

RELATED PATENT DATA

This patent resulted from a divisional application of U.S. Pat. application Ser. No. 09/352,817, filed on Jul. 13, 1999. Now U.S. Pat. No. 6,318,381

TECHNICAL FIELD

The invention pertains to methods of vaporizing materials, and to methods of cleaning vaporization surfaces. In further aspects, the invention encompasses vapor forming devices comprising plasma generation circuitry configured to utilize a vaporization surface as a plasma electrode.

BACKGROUND OF THE INVENTION

Vapor forming apparatuses have many applications in modern semiconductor processing. Among the applications is utilization in chemical vapor deposition apparatuses. An exemplary chemical vapor deposition apparatus 10 is described with reference to FIG. 1. Apparatus 10 comprises a reaction chamber 12 having a substrate holder 14 contained therein. A substrate 16 is shown supported by substrate holder 14. Substrate 16 can comprise, for example, a semiconductive material wafer, such as, for example, a wafer of monocrystalline silicon.

Chamber 12 has a vapor inlet 18 extending therethrough and a vapor outlet 19 also extending therethrough. Accordingly, a vapor (illustrated by arrows 20) can be flowed through chamber 12.

Chamber 12 can comprise one or more temperature control mechanisms (not shown) which can include, for example, heaters, or cooling gas flow ports. The thermal controls can enable substrate 16 to be maintained in a temperature such that a material is deposited onto substrate 16 from the vapor 20 within chamber 12.

A vapor forming device 30 is provided to generate vapor 20. Device 30 comprises an inlet region 32 configured to enable flow of a non-vapor state material 33 into device 30. Device 30 further comprises an inlet port 34 configured to enable flow of a carrier gas 35 into on device 30. Additionally, device 30 comprises an outlet port 36 configured to enable vapor-state-material 20 to be output from device 30 and into reaction chamber 12 of apparatus 10.

A vaporizer 40 is within device 30 and supported by a holder 42. Vaporizer 40 comprises a surface 44 which can be referred to as a vaporization surface. Vaporizer 40 can comprise a heated material such that non-vapor-state-material 33 is converted from a non-vapor-state to a vapor-state upon contacting vaporization surface 44.

Material 33 is typically initially in the form of a liquid, and is flowed into device 30 from a holding reservoir 46. Although in the shown exemplary embodiment only one non-vapor-state material 33 is flowed into device 30, it is to be understood that a plurality of different non-vapor-state materials can be flowed simultaneously into device 30 to form a vapor 20 comprising a composite of vapors from the various materials. An exemplary application in which a plurality of non-vapor-state materials are flowed into device 30 is a chemical vapor deposition process for formation of barium strontium titanate (BST).

Two separate configurations of prior art vaporizer devices 30 are described with reference to FIGS. 2 and 3.

Referring first to FIG. 2, a first prior art vaporization device 30 is illustrated in diagrammatic, schematic view. Such device comprises a COVA device (COVA Technologies, Inc., 2260 Executive Circle, Colorado Springs, Colo. 80906).

The vaporization device 30 FIG. 2 comprises vaporizer 40 which includes a pillar 60 extending upwardly into the device. Holder 42, to the extent there is one in the device of FIG. 2, is defined by a bottom portion of pillar 60. The device 30 of FIG. 2 further includes a thermally conductive material 50 defining a void 52 therein. Material 50 is shaped to define an outer periphery 54 comprising sides 56 and ends 58. Material 50 is further configured to form pillar 60, which protrudes upwardly from one of the ends 58 and into a region between sides 56. The outlet region 36 and inlet region 34 of the device of FIG. 2 extend through material 50 to define gas passageways into and out of void region 52.

Non-vapor-state-material inlet 32 comprises three separate capillaries (32a, 32b, and 32c) extending through an end 58 and terminating above pillar region 60. Non-vapor-state material 33 comprises three separate materials (33a, 33b and 33c), which can comprise, for example, liquids.

In operation, material 50 is heated and non-vapor state materials 33a, 33b and 33c are flowed through inlets 32a, 32b and 32c and onto pillar region 60. The non-vapor state materials are then vaporized upon contact with a heated vaporization surface of pillar region 60 to form a vapor 20. Such vapor 20 then flows to outlet 36 and out of device 30. The three materials 33a, 33b and 33c can comprise, for example, Ba(THD)$_2$, Sr(THD)$_2$, and Ti(O-iPr)$_2$(THD)$_2$, in, for example, applications wherein a vapor is to be formed for deposition of BST. In the above formulas, THD stands for bis(2,2,6,6-tetramethyl-3,5-heptanedionate) (C$_{11}$H$_{19}$O)$_2$, and O-iPr stands for isopropoxide (C$_3$H$_7$O).

In the above-described application for forming BST, material 50 and pillar region 60 are preferably heated to a temperature of about 250° C. (Ba(THD)$_2$ vaporizes at about 212° C.). Also, the carrier gas 35 preferably comprises a temperature of about 250° C. Carrier gas 35 can comprise, for example, nitrogen or helium.

A second prior art vaporization device 30 is described with reference to FIG. 3. In the device of FIG. 3, vaporizer 40 comprises a heated frit, and holder 42 comprises a pair of projections extending from sides of frit 40. The embodiment of FIG. 3 further comprises an outer periphery 70 surrounding frit 40 and defining a void 72 therein. Inlet region 32 comprises three separate capillaries (labeled as 32a, 32b and 32c) which extend through periphery 70 and into void regions 72. Capillaries 32a, 32b and 32c are configured such that non-vapor-state-materials 33a, 33b and 33c flow through capillaries 32a, 32b and 32c and onto a vaporization surface 44 of frit 40.

In operation, frit 40 is heated to a temperature such that materials 33a, 33b and 33c are vaporized upon contact with surface 44 to form a vapor 20 which exits device 30 through outlet port 36. Also, a carrier gas 35 is injected into device 30 through inlet port 34 to flow vapor 20 out of device 30. Materials 33a, 33b and 33c can comprise, for example, Ba(THD)$_2$, Sr(THD)$_2$, and Ti(O-iPr)$_2$(THD)$_2$, for formation of BST. In such embodiments, frit 40 is preferably heated to a temperature of about 250° C., and carrier gas 35 is also preferably heated to a temperature of about 250° C. The system described with reference to FIG. 3 is a diagrammatic, schematic view of an Advanced Delivery and Chemical Systems vaporizer. (Advanced Delivery and Chemical Systems (ADCS), 7 Commerce Drive, Danbury Conn. 06810-4169.)

A problem with the prior art devices described above is that materials injected into the devices can decompose to form deposits on vaporization surfaces 44. A reason that the deposits form can be, for example, that the vaporization temperature is close to a decomposition temperature for non-vapor-state-materials 33 injected into devices 30. The deposits can decrease the effectiveness of vaporization surfaces 44, and can, for example, cause clogging and other problems due to particulate formation. Accordingly, it would be desirable to develop methods for cleaning deposits from surfaces 44.

SUMMARY OF THE INVENTION

In one aspect, the invention encompasses a method of utilizing a vaporization surface as an electrode to form a plasma within a vapor forming device.

In another aspect, the invention encompasses a method of chemical vapor deposition. A vaporization surface is provided and heated. At least one material is flowed past the heated surface to vaporize the material. A deposit forms on the vaporization surface during the vaporization. The vaporization surface is then utilized as an electrode to form a plasma, and at least a portion of the deposit is removed with the plasma.

In another aspect, the invention encompasses a vapor forming device. Such device includes a non-vapor-state-material input region, a vaporization surface, and a flow path between the non-vapor-state-material input region and the vaporization surface. The device further includes a vapor-state-material output region, and a vapor flow path from the vaporization surface to the vapor-state-material output region. Additionally, the device includes a first plasma electrode spaced from the vaporization surface, and plasma generation circuitry configured to utilize the vaporization surface as a second plasma electrode such that a plasma can be formed between the first and second plasma electrodes.

BRIEF DESCRIPTION OF THE DRAWINGS

Preferred embodiments of the invention are described below with reference to the following accompanying drawings.

FIG. 2 is a diagrammatic view of a prior art vaporization device.

FIG. 3 is a diagrammatic view of a second prior art vaporization device.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In a particular aspect, the invention encompasses modification of a vaporization device 30 (exemplary vaporization devices are described above with reference to FIGS. 1–3) to enable plasma cleaning of vaporization surface 44. Such aspect is described with reference to FIG. 4. In referring to FIG. 4, similar numbers will be utilized as were used above in describing the prior art devices of FIGS. 1–3, with the suffix "d" utilized to indicate features of the structure of FIG. 4.

Figure 4:
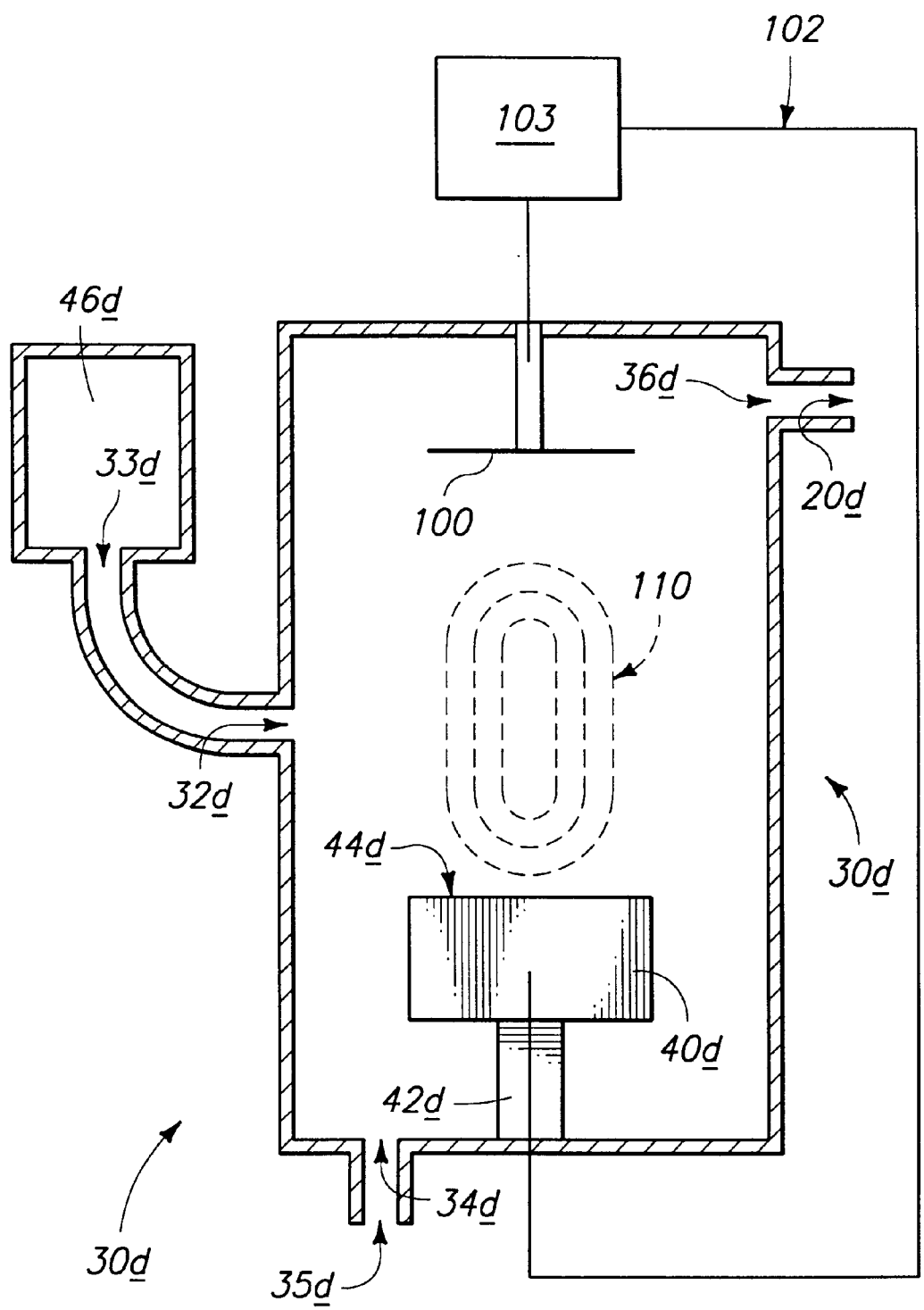
FIG. 4 is a diagrammatic view of a vaporization device encompassed by the present invention.

FIG. 4 illustrates a vaporization device 30d comprising a vaporization material 40d having a vaporization surface 44d. Material 40d preferably comprises an electrically conductive material, such as, for example, stainless steel.

In the exemplary shown embodiment, vaporization material 40 is supported by a holder 42d. It is to be understood, however, that holder 42d is optional. Device 30d further comprises a non-vapor-state-material inlet 32d, and a source 46d of non-vapor-state material 33d. Additionally, device 30d comprises a carrier gas inlet 34d into which a carrier gas 35d is flowed, and a vapor-state-material outlet 36d from which vapor-state material 20d exits device 30d.

Device 30d can comprise, for example, the components described above with reference to FIGS. 1–3 for vaporizing a non-vapor-state-material. However, in contrast to the prior art vaporization apparatuses described above with reference to FIGS. 1–3, the device 30d of FIG. 4 comprises an electrode 100 and circuitry 102 extending between electrode 100 and vaporization material 40d. Electrode 100 and circuitry 102 are configured to generate a plasma 110 between electrode 100 and material 40d. Accordingly, device 30d is configured to utilize vaporization material 40d as an electrode for generating a plasma 110.

Plasma 110 can be utilized to clean deposits from vaporization surface 44d. In the shown embodiment, circuitry 102 comprises a power source 103 which provides RF energy to electrode 100. Power source 103 can also be utilized to provide a bias to vaporization material 40d. Alternatively, power can be provided to material 40d, and a bias provided to electrode 100. In yet other alternative embodiments, power can be provided to one of electrode 100 or material 40d, and the other of electrode 100 and material 40d can be maintained at ground potential.

In an exemplary application, plasma 110 is formed by providing an energy of from about 200 watts to about 2,000 watts to one of either electrode 100 or material 40d, with a preferred energy being about 500 watts. A temperature within device 30d is maintained at about 250° C. during formation of plasma 110, and a pressure is maintained at less than or equal to about 1 Torr, and greater than 0 Torr.

Plasma 110 can be formed from gases comprising one or more of $Cl_2$, $CCl_4$, $CF_4$, $CHF_3$, $O_{2,\ SF6}$, $NF_3$, $CCl_3F$, $CClF_3$, $C_2F_6$, $H_2$, $C_3F_8$, and $O_3$. Such gases can be injected through carrier gas inlet port 34d, or through a separate port (not shown) provided within device 30d. In an exemplary application, a plasma gas comprising one or more of $Cl_2$, $CCl_4$ and $CF_4$ is flowed into device 30d at a rate of from about 1 standard cubic centimeter per minute (sccm) to about 2000 sccm. Also, in the exemplary application, electrode 100 is provided with an RF power of from about 200 watts to about 2,000 watts, and material 40d is provided with a bias of from about −1,000 volts to about −20,000 volts. The negative bias produces a positive/negative attraction such that plasma ions are drawn rapidly to vaporization surface 44d for cleaning of the surface.

Figure 1:
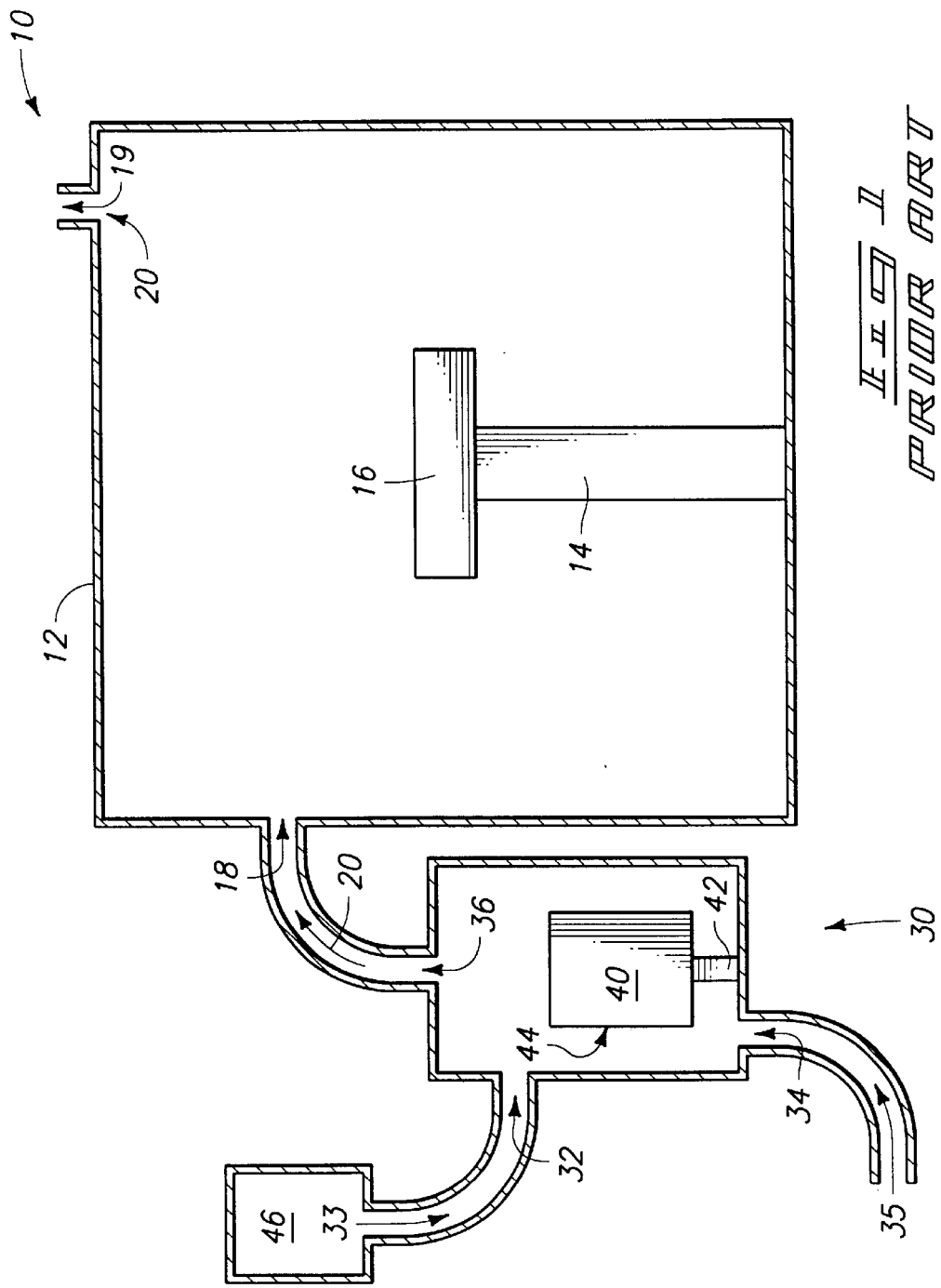
FIG. 1 is a diagrammatic view of a prior art chemical vapor deposition apparatus.

Device 30d can be incorporated into a prior art chemical vapor deposition apparatus, such as, for example, the apparatus 10 described with reference to FIG. 1. In such application, device 30d is in gaseous communication with chemical vapor deposition reactor 12 such that vapor 20d flows from outlet 36d into vapor deposition reactor 12. Such vapor can then be utilized to deposit a material over substrate 16. At periodic intervals, a flow of non-vapor-material into device 30d is stopped, and plasma 110 is formed within device 30d to clean vaporization surface 44d. The flow of non-vapor-material 33d into device 30d can be stopped by providing a valve (not shown) between source 46d and inlet 32d.

Although the invention is described above with reference to a vaporization device incorporated as part of a chemical vapor deposition apparatus, it is to be understood, that the invention can be utilized in other applications wherein vapor is generated. Such other applications can include, for example, deposition of thin films for wear resistance or corrosion resistance.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A vapor forming device comprising:
   a non-vapor-state-material inlet region;
   a vaporization surface configured to vaporize the non-vapor-state-material;
   a flow path between the non-vapor-state-material inlet region and the vaporization surface;
   a carrier gas inlet port into the vapor forming device;
   a first plasma electrode spaced from the vaporization surface and not a part of the non-vapor-state-material inlet region or the carrier gas inlet port, and
   plasma generation circuitry configured to utilize the vaporization surface as a second plasma electrode and to form a vaporization surface cleaning plasma between the first and second plasma electrodes.

2. The vapor forming device of claim 1 wherein the plasma generation circuitry is configured to hold the vaporization surface at ground potential and supply RF energy to the first plasma electrode to form the plasma.

3. The vapor forming device of claim 1 wherein the plasma generation circuitry is configured to supply RF energy to the vaporization surface and hold the first plasma electrode at ground potential to form the plasma.

4. The vapor forming device of claim 1 wherein the plasma generation circuitry is configured to provide a negative bias power to the vaporization surface and supply RF energy to the first plasma electrode to form the plasma.

5. The vapor forming device of claim 4 wherein the negative bias power is from about −1000 volts to about −20000 volts.

6. A vapor forming device comprising:
   a non-vapor-state-material input region;
   a vaporization surface;
   a flow path between the non-vapor-state-material input region and the vaporization surface;
   a vapor-state-material output region;
   a vapor flow path from the vaporization surface to the vapor-state-material output region;
   a first plasma electrode spaced from the vaporization surface and not a part of the non-vapor-state-material input region; and
   plasma generation circuitry configured to utilize the vaporization surface as a second plasma electrode and to form a vaporization surface cleaning plasma between the first and second plasma electrodes.

7. The vaporization device of claim 6 being configured as a component of a chemical vapor deposition reactor, the vapor-state-material output region being in gaseous communication with a reaction chamber of the chemical vapor deposition reactor.

8. The vapor forming device of claim 6 wherein the plasma generation circuitry is configured to hold the vaporization surface at ground potential and supply RF energy to the first plasma electrode to form the plasma.

9. The vapor forming device of claim 6 wherein the plasma generation circuitry is configured to supply RF energy to the vaporization surface and hold the first plasma electrode at ground potential to form the plasma.

10. The vapor forming device of claim 6 wherein the plasma generation circuitry is configured to provide a negative bias power to the vaporization surface and supply RF energy to the first plasma electrode to form the plasma.

11. The vapor forming device of claim 10 wherein the negative bias power is from about −1000 volts to about −20000 volts.

12. A vapor forming device comprising:
   a vaporization surface configured to vaporize a non-vapor-state-material;
   a first plasma electrode spaced from the vaporization surface;
   a flow path between a non-vapor-state-material input region and the vaporization surface, the first plasma electrode not comprising part of the non-vapor-state-material input region: and
   plasma generation circuitry configured to utilize the vaporization surface as a second plasma electrode, to provide a negative bias power from about −1000 volts to about −20000 volts to the vaporization surface while the first plasma electrode is held at ground potential, and to form a vaporization surface cleaning plasma between the first and second plasma electrodes.

13. The vapor forming device of claim 12 further comprising:
   a flow path between a non-vapor-state-material input region and the vaporization surface; and
   a vapor flow path from the vaporization surface to a vapor-state-material output region.

* * * * *

UNITED STATES PATENT AND TRADEMARK OFFICE
CERTIFICATE OF CORRECTION

PATENT NO. : 6,626,999 B1 Page 1 of 1
DATED : September 30, 2003
INVENTOR(S) : Eugene P. Marsh It is certified that error appears in the above-identified patent and that said Letters Patent is hereby corrected as shown below:

Title page,
Item [56] References Cited, OTHER PUBLICATIONS, please delete "Kaus" after "by" and insert -- Klaus --.

Column 2,
Line 31, please delete "$(C_{11}H_{19}O)_2$," and insert -- $(C_{11}H_{19}O_2)$, --.

Signed and Sealed this

Fourth Day of January, 2005

JON W. DUDAS
*Director of the United States Patent and Trademark Office*